(12) United States Patent
Rebstock

(10) Patent No.: US 9,312,152 B2
(45) Date of Patent: Apr. 12, 2016

(54) RECIRCULATION SUBSTRATE CONTAINER PURGING SYSTEMS AND METHODS

(71) Applicant: Brooks CCS GmbH, Radolfzell (DE)

(72) Inventor: Lutz Rebstock, Gaienhofen (DE)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 14/569,662

(22) Filed: Dec. 13, 2014

(65) Prior Publication Data

US 2015/0170939 A1    Jun. 18, 2015

Related U.S. Application Data

(60) Provisional application No. 61/916,071, filed on Dec. 13, 2013.

(51) Int. Cl.
*H01L 21/67* (2006.01)
*B08B 9/032* (2006.01)
*H01L 21/673* (2006.01)

(52) U.S. Cl.
CPC ........ *H01L 21/67017* (2013.01); *B08B 9/0321* (2013.01); *H01L 21/67393* (2013.01); *Y10T 137/0419* (2015.04); *Y10T 137/4259* (2015.04)

(58) Field of Classification Search
CPC ................... H01L 21/67017; H01L 21/67393; B08B 9/0321
USPC .................................................. 137/237, 240
See application file for complete search history.

(56) References Cited

U.S. PATENT DOCUMENTS

| | | | | |
|---|---|---|---|---|
| 4,724,874 A | * | 2/1988 | Parikh | H01L 21/67393 141/383 |
| 5,581,903 A | * | 12/1996 | Botich | B01D 53/261 D53/261 |
| 7,314,068 B2 | * | 1/2008 | Nakano | H01L 21/67017 141/66 |

* cited by examiner

*Primary Examiner* — Kevin Lee
(74) *Attorney, Agent, or Firm* — Perman & Green, LLP; Colin C. Durham

(57) ABSTRACT

Methods and systems to reduce the consumption of purge gas for semiconductor substrate containers. The recirculation purging system recycles purge gas back to substrate containers by filtering and purifying gas flow from substrate containers, receiving gas flow from load port, or including a recirculation tank.

7 Claims, 13 Drawing Sheets

RECIRCULATION SUBSTRATE CONTAINER PURGING SYSTEMS AND METHODS

CLAIMS OF PRIORITY

This patent application claims priority from U.S. provisional patent application Ser. No. 61/916,071, filed on Dec. 13, 2013, entitled "Recirculation Substrate Container Purging Systems and Methods".

FIELD OF TECHNOLOGY

This disclosure relates generally to the purging of a substrate container and, more particularly, to a system and/or a method of reducing the consumption of purge, according to one or more embodiments.

BACKGROUND

A carrier may protect the semiconductor substrates, for example, from foreign matter in the air and chemical contamination, by holding the substrates in a sealed space. The sealed carrier, such as a FOUP (front opening unified pod) or a SMIF (standard mechanical interface) pod, is generally formed from a high-performance plastic material. However, humidity and oxygen content tend to increase with time, due to the moisture permeability of plastic materials, or due to the oxygen molecular diffusion, since for reasons of safety and handling, carriers are generally not constructed to be hermetically sealed.

In addition, vaporized organic solvent from substrate coatings, such as a photoresist substrate, may adhere to the internal wall of the carrier. Thus the atmosphere inside the carrier may be contaminated with organic compounds.

As a measure against humidity, oxygen and organic contaminants in a carrier, dry air or nitrogen may be introduced to the sealed carrier to purge and replace the atmosphere inside the carrier. High purge flow, e.g., up to 150 l/min flow, together with larger volume containers, e.g., for 450 mm substrates, may require a significant amount of consumable purge gas.

Thus there is a need for a container purging system and method to reduce the consumption of purge gas, while maintain a cleanliness storage environment for the semiconductor substrates.

SUMMARY

In some embodiments, the present invention discloses methods and systems to reduce the consumption of purge gas for semiconductor substrate containers. A recirculation purging system may recycle the purge gas, for example, through a filter, back to the container. Moisture sensor may be included to monitor the humidity of the recycled purge gas, allowing the purge gas to maintain the dryness level inside the container.

In some embodiments, the recirculation purging system may receive a gas flow from the container, and then return the gas flow to the container, after optionally filtering and purifying. Moisture sensor may be installed, either in the container or in the recirculation line, to monitor the level of moisture, which may be used to regulate the moisture level in the container. For example, once the moisture level exceeds a predetermined level, fresh dry air or nitrogen may be added to the recirculation purging line to lower the humidity level. The recirculation purging system may potentially save a lot of facility gas, e.g., clean dry air or nitrogen, while maintaining the required cleanliness environment inside the containers.

In some embodiments, the recirculation purging system may receive a gas flow from the load port in which the container is placed. The recirculation purging system then may direct the gas flow to the container, after optionally filtering and purifying. Since the container is not hermetically sealed, the purging gas may escape to the load port, and be recirculated. Moisture sensor may be installed to regulate the moisture level in the container.

In some embodiments, the recirculation purging system may include a recirculator tank, which provides a purge flow to the container and which accepts a return flow from the container. The gas within the recirculator tank may be recirculated via a purifier to reduce the humidity level. The purifier thus may capture contaminants and moisture from the return flow from the container, and may supply a clean dry recirculated gas to the container.

DETAILED DESCRIPTION

In some embodiments, the invention relates to the purging of a container for substrates, such as semiconductor wafers, flat panel displays, and other products requiring clean environments while the container is stored in a storage chamber or while the container interfaces with a process tool or other sealed chamber.

In some embodiments, the present invention discloses an improved purging method and system for semiconductor substrate containers to ensure a clean lines environment while reducing the consumption of facility gases. The semiconductor substrate containers may include wafer boxes (e.g., individual wafer box, cassette wafer box, FOUP and SMIF pods), reticle boxes (e.g., individual reticle box, multiple reticle box) and stocker (storage of wafer boxes or reticle boxes, storage of bare wafers or bare reticles). In some embodiments, a recirculation purging system may be used for purging semiconductor substrate containers, for example, when placed in a load port for storage or waiting to be processed. The quality of the purge gas maybe guaranteed by a filtering and purifier system, which is configured to remove particulate, organic and moisture contaminants from the recirculated purge flow. In addition, sensors, such as moisture sensor, maybe used to monitor the quality of the purge gas, allowing replacing or refreshing the recirculated purge gas with fresh dry gas.

The use of sealed containers, such as SMIF and FOUP systems to control the environment of sensitive semiconductor substrates during storage and transport within a fabrication facility has greatly improved process control and reduced device contamination. The containers maybe continuously purged to maintain a clean dry environment, which may prevent contaminating the substrates, for example, from the container ambient or from the container outgasing.

Though embodiments of the invention are described with respect to purging containers such as FOUPs and other SMIF pods, it should be understood that the present invention maybe applied to all types of substrate containers.

Figure 1A:
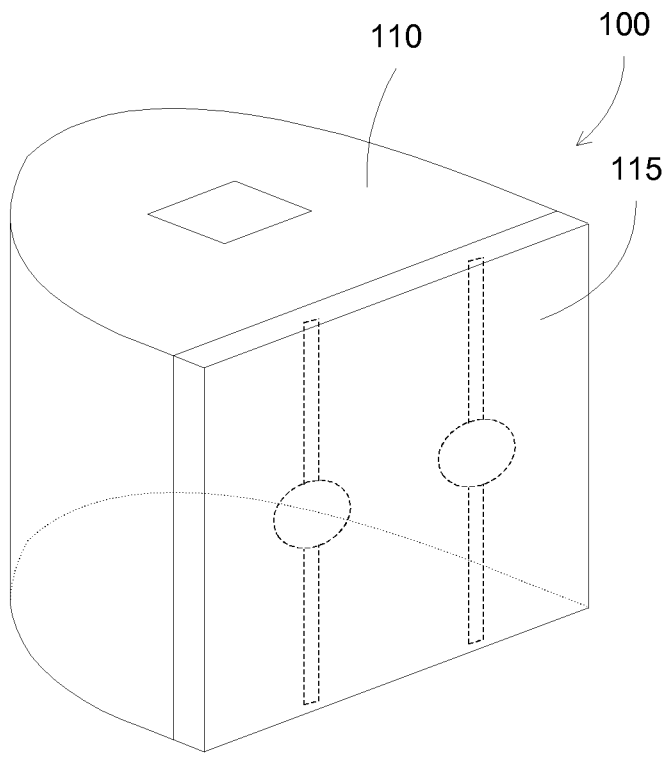
FIGS. 1A-1B illustrate a FOUP container according to some embodiments.
Figure 1B:
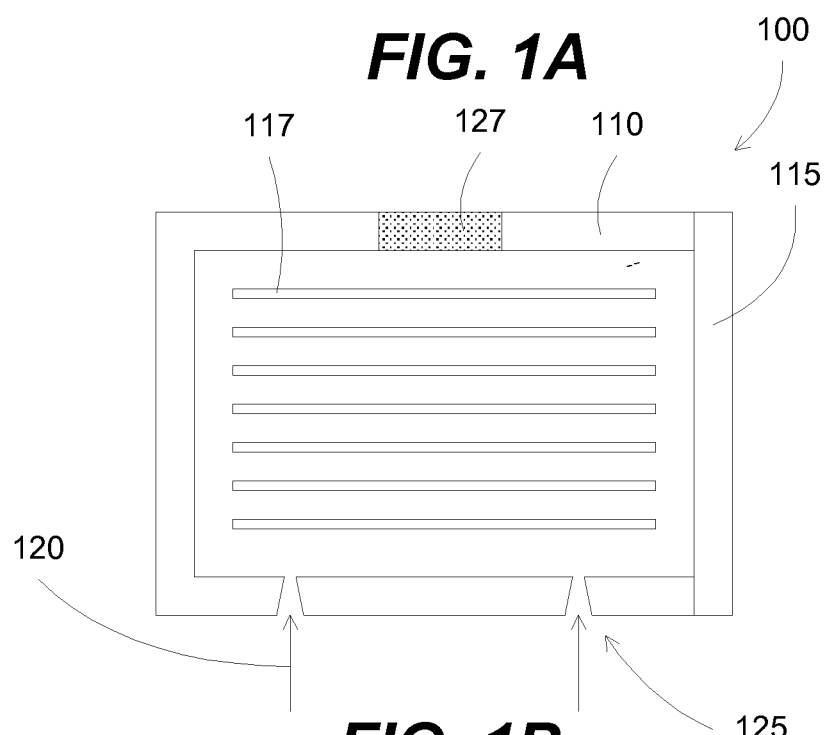

FIGS. 1A-1B illustrate a FOUP container according to some embodiments. FIG. 1A shows a perspective view and FIG. 1B shows across section view of a FOUP container 100, which may be used to storing semiconductor substrates 117, such as silicon wafers. The FOUP 100 may include a FOUP door 115 coupled to a FOUP body 110. The FOUP 100 may have some in lets 125 for accepting a purge gas 120, such as clean dry air or nitrogen. The FOUP 100 may have a filter 127, which allows equalization of inside and outside ambient of the FOUP through the escape of the purge gas. Alternatively, one-way valve (such as a none way flap) maybe provided to allow purge air to escape, while preventing outside air from coming in.

Figure 2A:
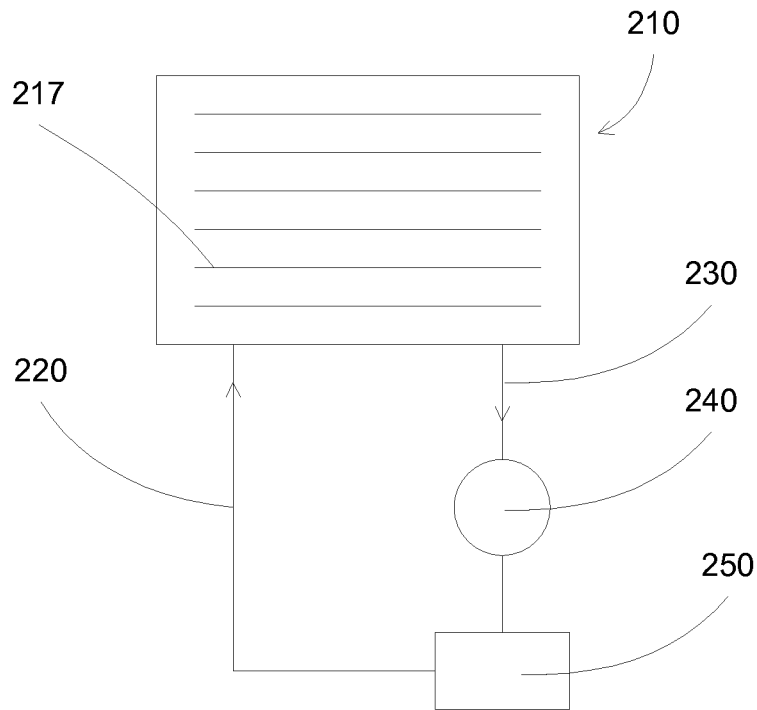
FIGS. 2A-2B illustrate configurations for recirculation purging of a container according to some embodiments.
Figure 2B:
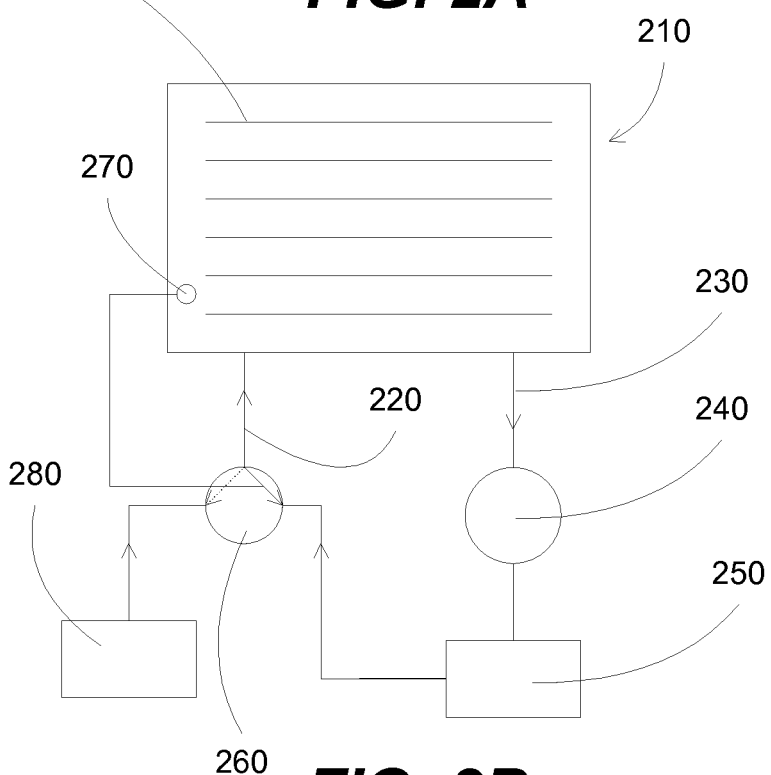

FIGS. 2A-2B illustrate configurations for recirculation purging of a container according to some embodiments. The gas inside the container maybe purged, e.g., a purge gas maybe provided to the inside of the container to replace the gas atmosphere in the container. A purge module may include a gas tank supplying a purge gas to one or more purge nozzles of the container. Any purge gas may be used, such as clean dry air or nitrogen. Other purge gases maybe used, such as argon, oxygen, and mixtures thereof.

High purge flow may be required, especially for advanced semiconductor devices. For example, purging 450 mm containers may require a purge flow of 150 l/min. Other purge flow may be used, such as less than 300 l/min, or less than 200 l/min.

A recirculation purging system may significantly reduce the consumption of purge gas while maintaining the required cleanliness level. For example, the recirculated purge gas may be replaced with fresh purge gas when the contamination in the container or in the recirculated purge gas exceeds an acceptable level. Alternatively, fresh purge gas may be added to the recirculated purge gas to reduce the contamination level. A sensor may be included to automatically maintain the desired cleanliness level of the recirculated purge gas.

In FIG. 2A, a purge gas 220 may be provided to a container 210, which may be configured to store multiple substrates 217. The container 210 may be sealed, e.g., isolated from the outside environment. In some embodiments, the container is not hermetically sealed, for example, a filter (not shown) may be used to allow gas inside the container to escape. The pressure inside the container may be higher than the outside atmospheric pressure, thus minimizing gases from coming into the container. The container may include one-way valve, which is configured to allow inside gas to escape, but not outside gas to come in.

Gases inside the container 210 may be received 230 and recirculated back 220 to the container. Optional components may be included in the recirculation path, such as a pump 240 for extracting the gas flow 230 from the container, and a filter/purifier 250 for cleaning the exhaust gas before returning the exhaust gas back to the container. The filter may be used to remove particles from the flow stream, e.g., removing particles inside the container. The purifier may be used to remove moisture or other organic contaminants from the flow stream. Other configurations may be used, such as the filer is disposed before the pump.

In FIG. 2B, the recirculation purging system may include a recirculated path and a refresh path for adding fresh purge gas supply. A recirculated path may include a purge gas flow 220 to the container, an exhaust purge gas flow 230 from the container, a pump system 240, and a filter/purifier 250. A refresh path may include a fresh purge gas supply 280, which may be configured to replace or add to the recirculated purge gas. A switch mechanism 260 may be configured to either accept the recirculated purge gas, e.g., from the recirculated path, or accept the fresh dry purge gas from the fresh purge gas supply 280. The switch mechanism 260 may be controlled by a sensor 270, such as a moisture sensor. For example, when moisture sensor 270 detects a high level of moisture, the switch mechanism 260 is switched to accept fresh purge gas from the supply 280. After the moisture level goes down, e.g., to an acceptable level, the recirculation of the purge gas may resume, e.g., the switch mechanism 260 may switch back to accept the recirculated purge gas from the recirculated path. The sensor 270 may be placed anywhere to detect the contamination level of the purge gas, such as in the container (as shown), or in the recirculated path.

The switch mechanism 260 may be configured to replace the recirculated purge gas with the fresh purge gas. The switch may be configured to either accept the recirculated purge gas or the fresh purge gas, e.g., the switch is a toggle switch, switching between the recirculated purge gas and the fresh purge gas. The switch mechanism 260 may be configured to add the fresh purge gas to the recirculated purge gas. The switch may be configured to always maintain the recirculated purge gas flow, and to turn on or off the additional flow from the fresh purge gas supply.

Figure 3A:
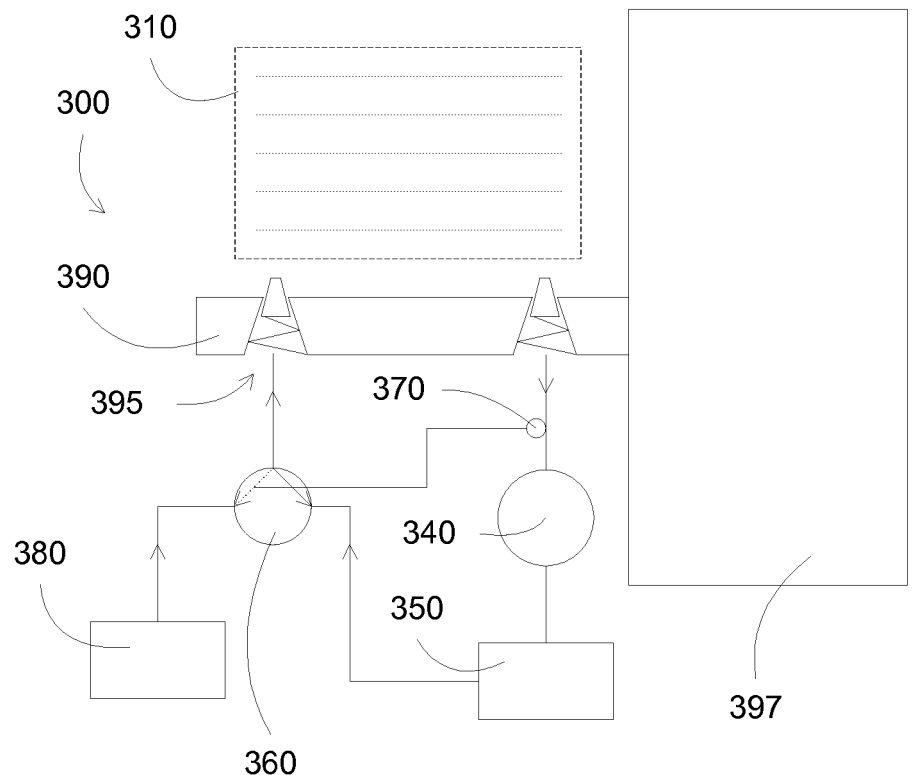
FIGS. 3A-3B illustrate load port systems having recirculation purging according to some embodiments.
Figure 3B:
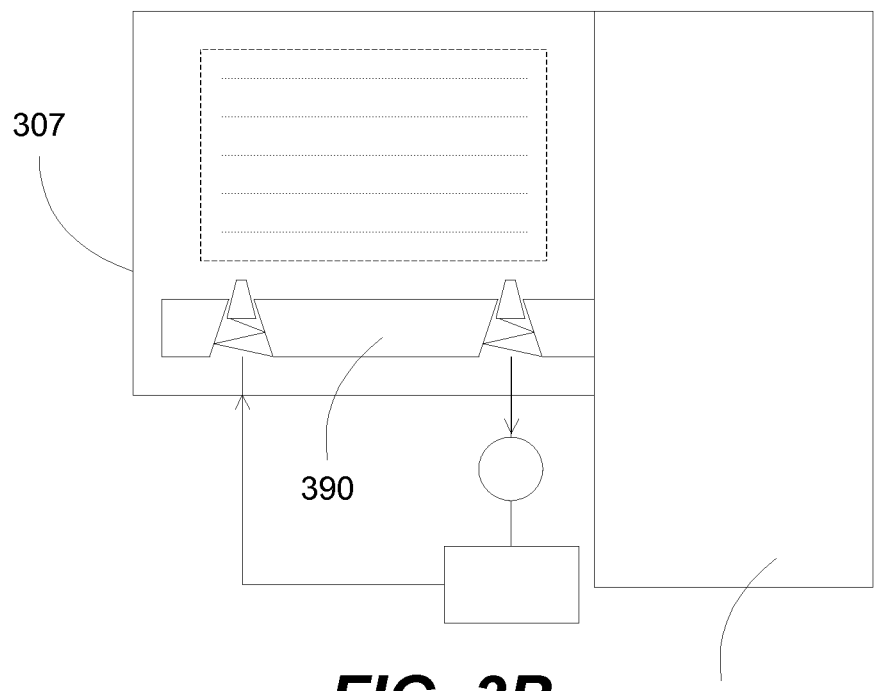

FIGS. 3A-3B illustrate load port systems having recirculation purging according to some embodiments. The recirculation purging system may be coupled to a load port, so that when a container is placed on a support of the load port, the recirculation purging system may be activated. A recirculated purge gas may be provided to the container to keep the container in a clean dry state.

Nozzles 395 may be disposed on a support 390 of a load port 300. The nozzles may be configured to provide a purge to the container 310. The nozzles may be normally close, and open when mated, e.g., when a container is placed on the support. For example, the nozzles may include a spring system, which pushes a nozzle plug upward to close the gas path. When the container is placed on the nozzle plug, the container may push the plug downward, opening the gas path to accept a purge gas flow to the container.

An optional manifold may be included to control the purging, so that the container may be purged periodically or continuously. Alignment sensor may be included to ensure that the container is properly aligned with the nozzles. In addition, other components may be included, such as a flow controller to control the flow rate of the purge gas, or a purifier or filter to remove any contaminants in the purge flow before allowing the purge flow to enter the container.

Multiple nozzles 395 may be included in the support 390. One nozzle may be configured to accept the purge gas to the container, and one nozzle may be configured to exhaust the purge gas from the container. A recirculation purging system may be coupled to the support 390, including a recirculated path and a refresh path. A recirculated path may include a purge gas flow to a nozzle to the container, an exhaust purge gas flow from another nozzle from the container, a pump system 340, and a filter/purifier 350. A refresh path may include a fresh purge gas supply 380, which may be configured to replace or add to the recirculated purge gas. A switch mechanism 360 may be configured to switch between the recirculated purge gas flow or the refresh purge gas flow, which may allow the fresh purge gas to replace the recirculated purge gas. The switch mechanism 360 may be configured to switch the connection of the refresh purge gas flow to the recirculated purge gas flow, which may allow the fresh purge gas to add to the recirculated purge gas.

The switch mechanism 360 may be controlled by a sensor 370, such as a moisture sensor. For example, when moisture sensor 370 detects a high level of moisture in the recirculated purge flow, the switch mechanism 360 is switched to accept fresh purge gas from the supply 380. After the moisture level goes down, e.g., to an acceptable level, the recirculation of the purge gas may resume, e.g., the switch mechanism 360 may switch back to accept the recirculated purge gas from the recirculated path. Additional sensors or analytical devices may be added to monitor the contaminant concentration in the recirculated purge gas flow.

The load port may be an open load port, e.g., the container is exposed to the outside ambient (FIG. 3A). The load port may be a sealed load port, e.g., the container is placed in a controlled environment 307, such as a vacuum environment (FIG. 3B). For example, the load port may have an opening to accept the container. After the opening is closed, for example, by a load port door, the load port ambient is evacuated. The evacuated load port may allow the connection of the container with a processing system 397, such as a vacuum processing chamber.

Figure 4A:
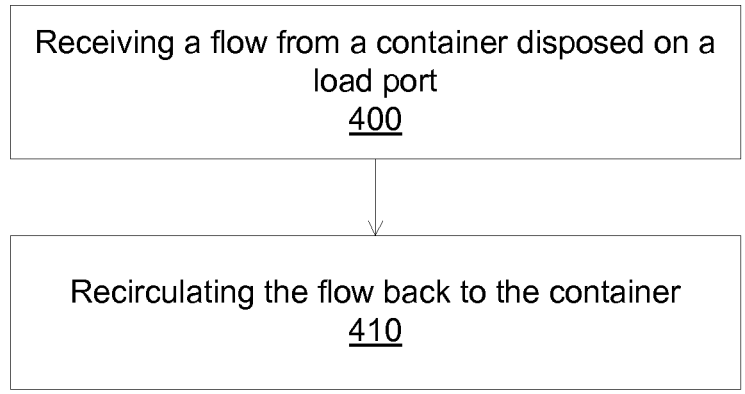
FIGS. 4A-4B illustrate flow charts for recirculation purging of a semiconductor container according to some embodiments.
Figure 4B:
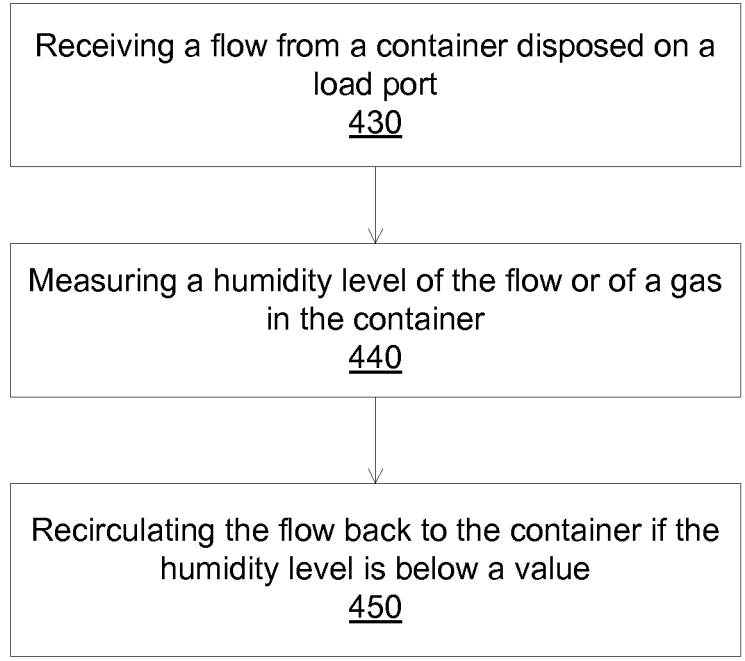

FIGS. 4A-4B illustrate flow charts for recirculation purging of a semiconductor container according to some embodiments. In FIG. 4A, a recirculated purge gas is applied to a container to purge the container. A purge flow may be provided to the container. The gas inside the container may be exhausted to a recirculation system, which may return the gas to the container, after optionally filtering and/or purifying the gas flow. Operation 400 receives a flow from a container, which is disposed on a support, such as a support of a load port. Operation 410 recirculates the flow back to the container, after an optional filtering and/or purifying operation. A nozzle may be coupled to the container for providing the recirculated purge flow to the container. Another nozzle may be coupled to the container for accepting a flow from the container, e.g., for exhausting the gas from the container.

In FIG. 4B, the recirculated purge flow may be monitored, for example, to assess the moisture level, the organic contamination level, or the particle level. When the contamination is below an acceptable level, for example, the moisture level is lower than an acceptable level, such as below 1 ppb or below 100 ppt, the purge flow exhausted from the container is recirculated back to the container, for example, to save facility gas consumption. If the contamination level exceeds the acceptable value, the exhaust purge gas is replaced with a fresh clean dry gas, e.g., a fresh clean dry gas is supplied to the container instead of the exhausted purge gas. Alternatively, a fresh clean dry gas may be added to the exhausted purge gas, and the combination of the fresh clean dry gas and the exhausted purge gas is supplied to the container.

Operation 430 receives a flow from a container, which is disposed on a load port, e.g., on a support of a open load port or on a support of a sealable load port. A pumping system may be used to extract the gas flow from the container. Operation 440 measures a humidity level of the gas in the flow or of the gas in the container. Operation 450 recirculates the flow back to the container if the humidity level is below an acceptable value, such as below 1 ppb or below 100 ppt. If the humidity level is high, e.g., higher than 1 ppb or higher than 100 ppt, fresh clean dry gas may be used, either to replace or to add, to the flow.

In some embodiments, cyclic recirculating purge gas flow may be used. The nozzles configuration, in some cases, might not be optimized for a continuous recirculating purge flow. For example, the input purge gas may be bypassed directly to the output exhaust gas, without spending enough time in the container for removing moisture or other contaminants. A cyclic recirculating purge gas flow may improve the contaminant removal process. For example, the input purge gas may be close while the output purge exhaust maybe performed, evacuate the gas inside the container. Then the input purge gas is turned on, flowing purge gas to the container. During the input purge gas flow, the output purge exhaust may be shut off or may be continued to flow.

Figure 5:
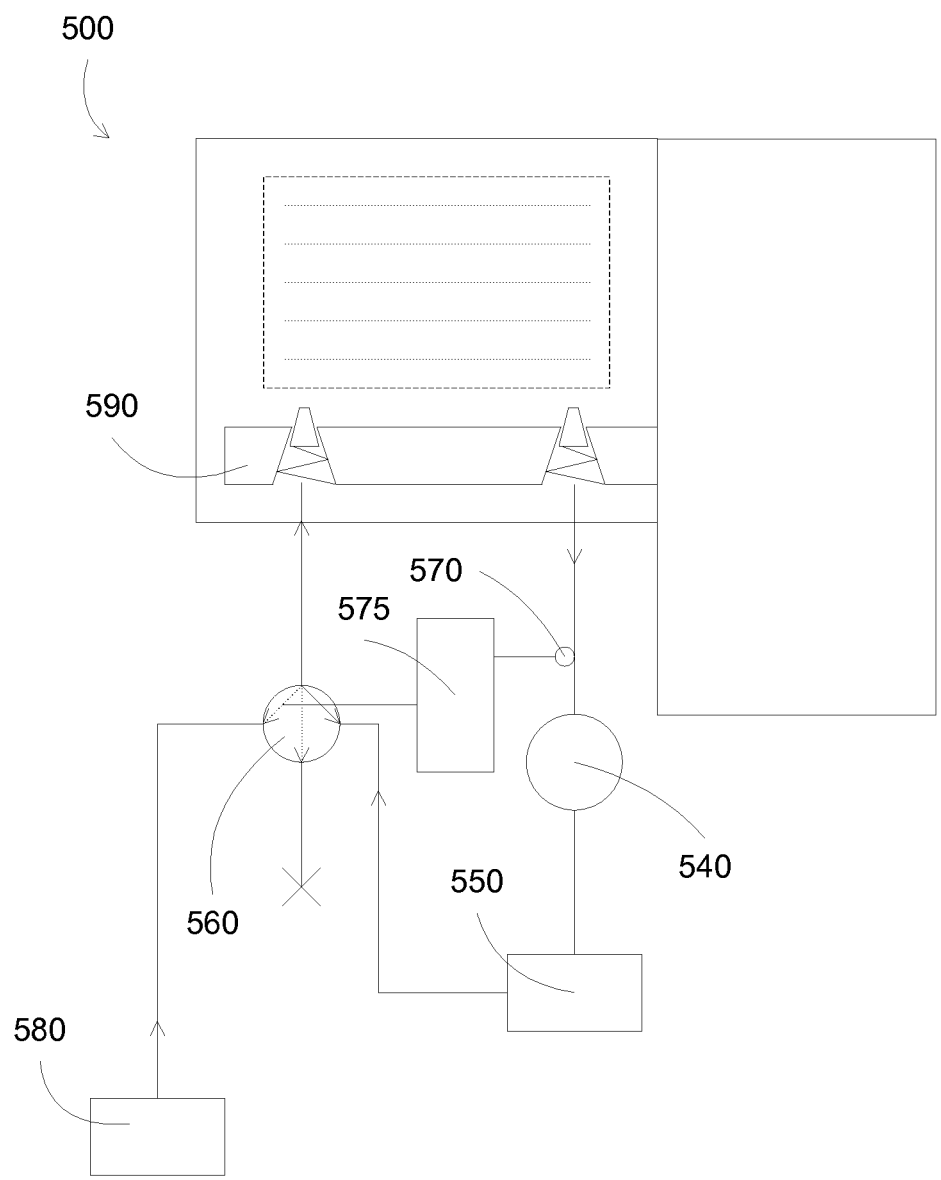
FIG. 5 illustrates a load port system having recirculation purging according to some embodiments.

FIG. 5 illustrates a load port system having recirculation purging according to some embodiments. The recirculation purging system may be coupled to a sealable load port, so that when a container is placed on a support of the load port, the recirculation purging system may be activated. Nozzles may be disposed on a support 590 of a load port 500. The nozzles may be configured to provide a purge to the container.

A recirculation purging system may be coupled to the support 590, including a recirculated path and a refresh path. A recirculated path may include a purge gas flow to a nozzle to the container, an exhaust purge gas flow from another nozzle from the container, a pump system 540, and a filter/purifier 550. A refresh path may include a fresh purge gas supply 580, which may be configured to replace or add to the recirculated purge gas. A switch mechanism 560 may be configured to switch between the recirculated purge gas flow, the refresh purge gas flow, or a close conduit to shut off the purge gas flow.

The switch mechanism 560 may be controlled by a sensor 570, such as a moisture sensor. Thus the switch 560 may switch between fresh clean dry gas or recirculated purge gas. Further, the switch 560 may be controlled by a controller 575, which may perform a cyclic recirculated purge flow. For example, when the moisture level is low, e.g., below the acceptable level, the controller may periodically toggle the input purge flow between the close state and the recirculated purge gas. This may allow a periodic pumping and purging of the container using the recirculated purge gas. When the moisture level is high, e.g., above the acceptable level, the controller may periodically toggle the input purge flow between the close state and the fresh purge gas. This may allow a periodic pumping and purging of the container using the fresh purge gas. Alternatively, the controller may toggle the input purge flow between the fresh purge gas and the recirculated purge gas, or between the close state, the fresh purge gas, and the recirculated purge gas.

Figure 6:
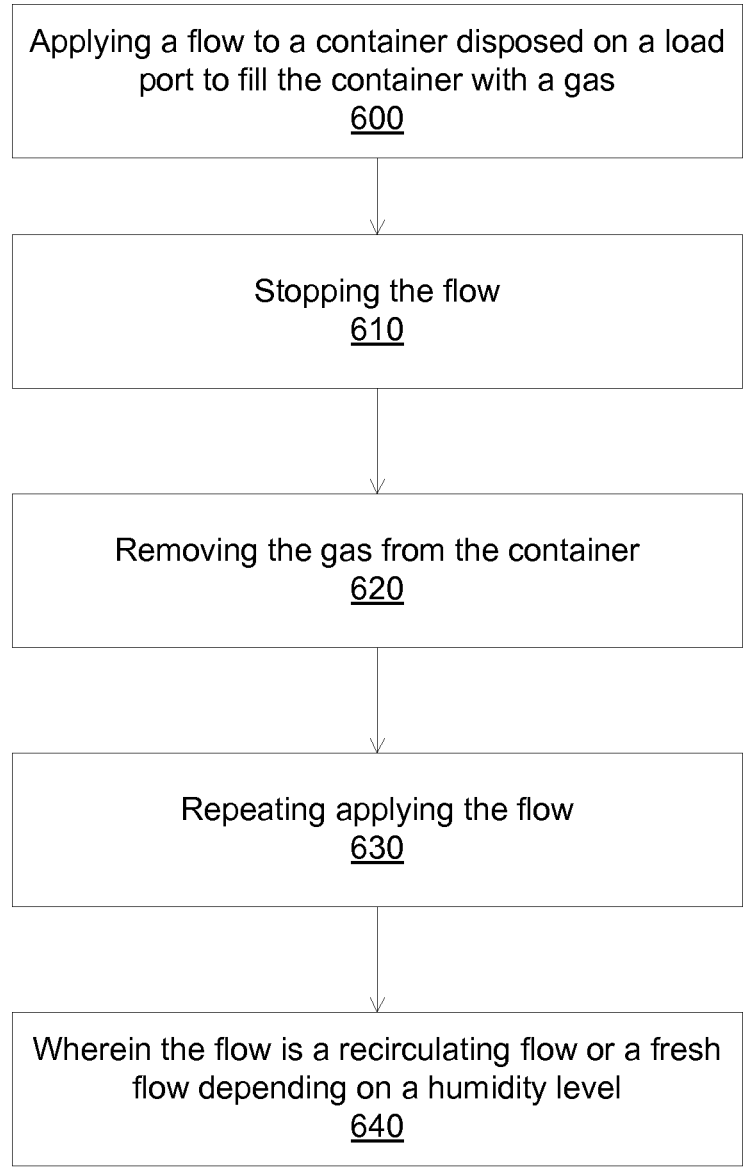
FIG. 6 illustrates a flow chart for recirculation purging of a semiconductor container according to some embodiments.

FIG. 6 illustrates a flow chart for recirculation purging of a semiconductor container according to some embodiments. A cyclic recirculated purge gas may be used to purge the container. Operation 600 applies a flow to a container, which is disposed on a support, such as a support of a load port. Operation 610 stops the flow. Operation 620 exhausts the gas inside the container, for example, by a pumping system. Operation 630 repeats the operation, e.g., re-applying the flow to the container. In operation 640, the flow may be a recirculated purge flow, a fresh purge flow, or a mixture of a recirculated purge flow and a fresh purge flow, depending on a monitored humidity level.

In some embodiments, a recirculation tank may be used for recirculating the purge gas in a container. For example, a recirculation tank may be placed in the recirculation path of the purge gas, allowing the purge gas to be continuously recirculated, e.g., continuously purifying and filtering.

Figure 7:
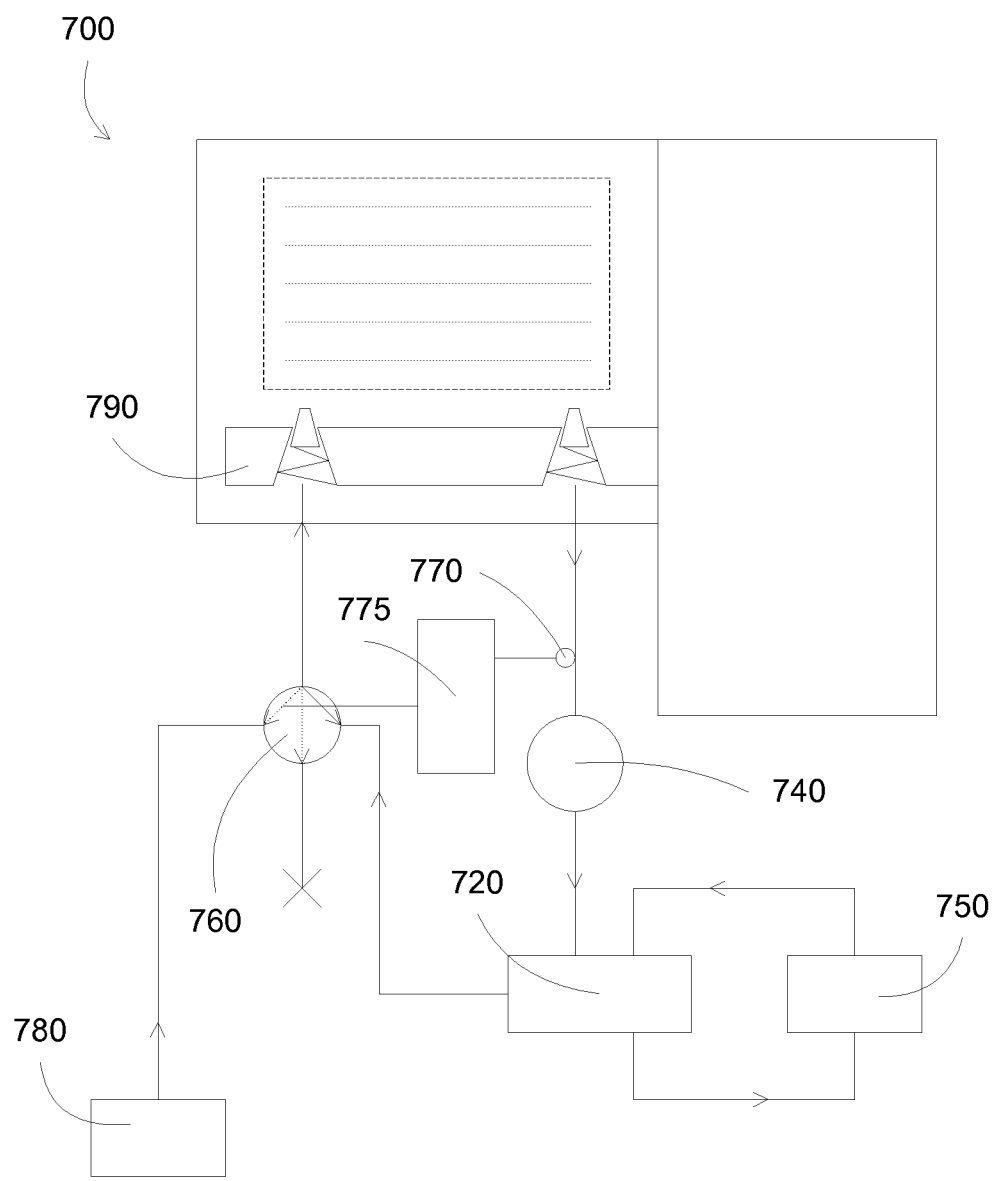
FIG. 7 illustrates a load port system having recirculation purging according to some embodiments.

FIG. 7 illustrates a load port system having recirculation purging according to some embodiments. The recirculation purging system may be coupled to a sealable load port, so that when a container is placed on a support of the load port, the recirculation purging system may be activated. Nozzles may be disposed on a support 790 of a load port 700. The nozzles may be configured to provide a purge to the container.

A recirculation purging system may be coupled to the support 790, including a recirculated path and a refresh path. A recirculated path may include a purge gas flow to a nozzle to the container, an exhaust purge gas flow from another nozzle from the container, a pump system 740, and a recirculation/purifier assembly, which includes a recirculation tank 720 and a filter/purifier 750.

The recirculation/purifier assembly may be configured to purify the exhaust purge gas, e.g., the gas inside the container. The purge gas, after exiting the container, may be continuously and repeatedly purified through the purifier 750. After being purified, the exhaust gas may be recirculated back to the container.

A refresh path may include a fresh purge gas supply 780, which may be configured to replace or add to the recirculated purge gas. A switch mechanism 760 may be configured to switch between the recirculated purge gas flow, the refresh purge gas flow, or a close conduit to shut off the purge gas flow. The switch mechanism 760 may be controlled by a sensor 770, such as a moisture sensor. Thus the switch 760 may switch between fresh clean dry gas or recirculated purge gas. Further, the switch 760 may be controlled by a controller 775, which may perform a cyclic recirculated purge flow.

In some embodiments, the purifier may include a purification material, and may be configured to purify the gas flowing to the recirculation tank. The pumping system, which may include a pump or a fan, may be used to generate a gas flow through the purifier. The purification material may include a desiccating material, which is configured to remove moisture from the recirculated gas flow. The purification material may include activated carbon fibers.

Multiple purifiers may be used. for example, a first purifier removes moisture carbon dioxide. A second purifier removes moisture, carbon monoxide, sulfur oxides, nitrogen oxides, or other contaminants. A molecular sieve purifier and a catalytic purifier may be used as the purifiers.

Other configurations may be used, such as a particle filter (such as a HEPA or ULPA filter) for removing particles, a moisture purifier (such as molecular sieve moisture purifier) for removing moisture, and an organic contaminant filter (such as an activated carbon filter, or a TiO2 photo catalyst filter and a UV lamp) for removing organic contaminants such as a volatile organic compound (VOC). An ionizer may be optionally added to remove static electricity.

Figure 8:
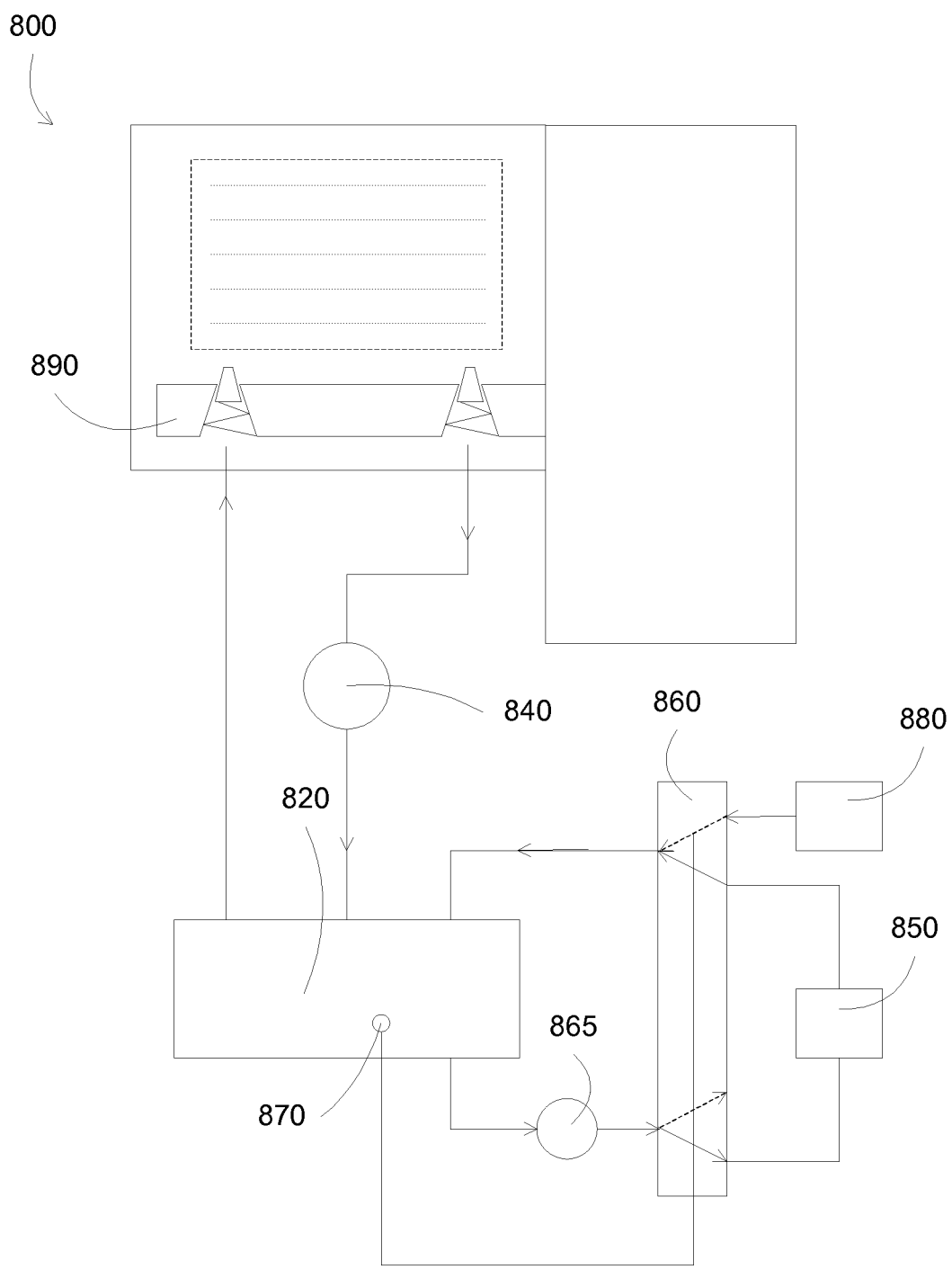
FIG. 8 illustrates a load port system having recirculation purging according to some embodiments.

FIG. 8 illustrates a load port system having recirculation purging according to some embodiments. The recirculation purging system may be coupled to a sealable load port, so that when a container is placed on a support of the load port, the recirculation purging system may be activated. Nozzles may be disposed on a support 890 of a load port 800. The nozzles may be configured to provide a purge to the container.

A recirculation purging system may be coupled to the support 890, including an optional pump system 840 and a recirculation/purifier assembly, which includes a recirculation tank 820 a filter/purifier 850, and a pump system 865. The pump system 865 may recirculate the purge gas in the recirculation tank 820 through a purifier 850, thus may continuously and repeatedly purify the gas in the recirculation tank, such as continuously removing moisture from the recirculated gas. After being purified, the exhaust gas may be recirculated back to the container.

A refresh path may include a fresh purge gas supply 880, which may be configured to replace or add to the recirculated purge gas. A switch mechanism 860 may be configured to switch between the recirculated purge gas flow and the refresh purge gas flow. The switch mechanism 860 may be controlled by a sensor 870, such as a moisture sensor, which may be disposed in the recirculation tank 820 (or at any other places such as in the recirculation path. Thus the switch 860 may switch between fresh clean dry gas or recirculated purge gas. Further, the switch 860 may be controlled by a controller, which may perform a cyclic recirculated purge flow. Other configurations may also be used, such as a cyclic recirculation purging system, in which the exhaust gas from the container is evacuated, followed by flowing purge gas to the container. One flow may be cyclic during the flow of the other flow. For example, the purge gas flow may be turned off and then turned on while the exhaust gas being evacuated. The exhaust gas may be continuously evacuated, or the exhaust gas may be stopped when the purge gas is turned on. Alternatively, the exhaust gas may be periodically turned off and then turned on while the purge gas is flowed.

Figure 9:
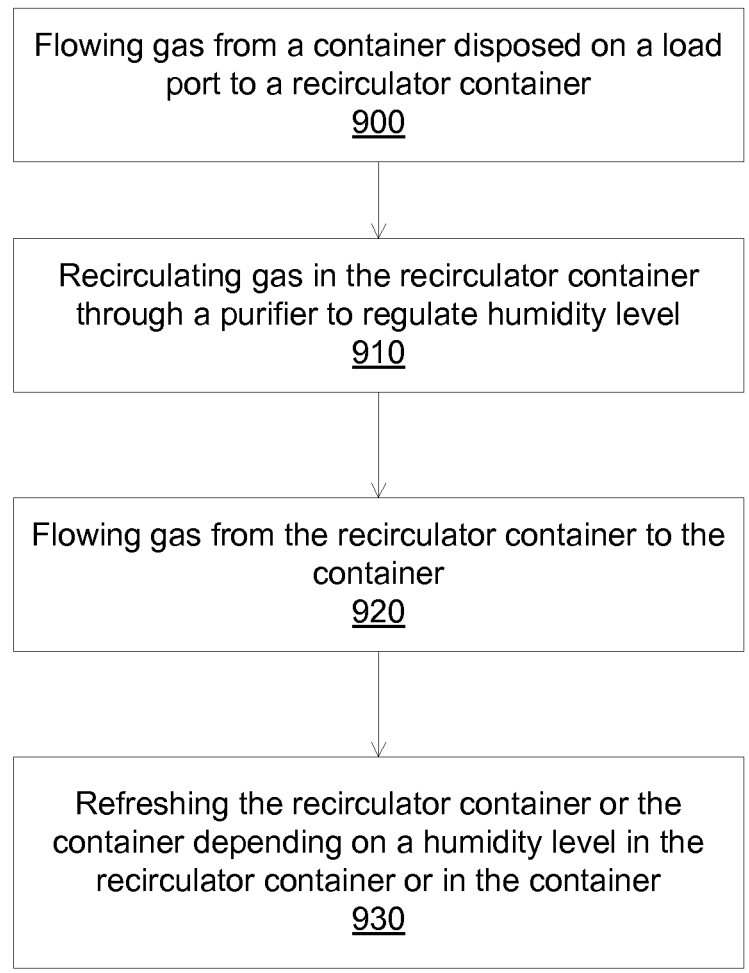
FIG. 9 illustrates a flow chart for recirculation purging of a semiconductor container according to some embodiments.

FIG. 9 illustrates a flow chart for recirculation purging of a semiconductor container according to some embodiments. A recirculated purge tank may be placed in the recirculation gas path to purge the container. Operation 900 flows a gas from a container, which is disposed on a support, such as a support of a load port. The gas may be an exhaust gas from the container, operable by a pumping system. The gas may be flowed to a recirculation tank. Operation 910 recirculates the gas in the recirculation tank through a purifier to regulate the humidity level. Operation 920 flows the gas from the recirculation tank back to the container, for example, by a pumping system. Operation 930 refreshes the gas in the recirculation tank depending on the humidity level, either in the recirculation tank, in the container, or in the recirculation gas path. Gases in the recirculation tank may be replaced by a fresh gas from a clean dry gas source. Gases in the recirculation tank may be added with a fresh gas from a clean dry gas source.

Figure 10:
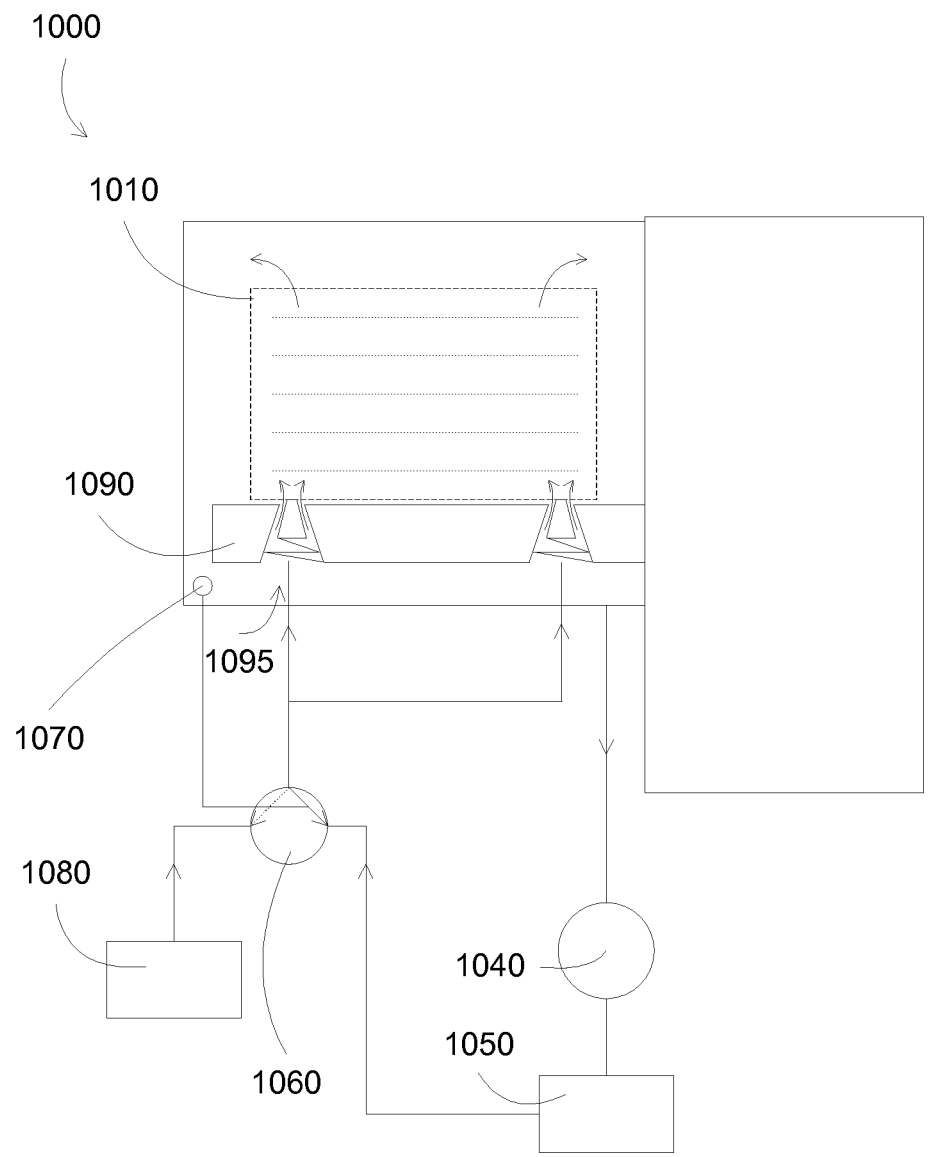
FIG. 10 illustrates a load port system having recirculation purging according to some embodiments.

In some embodiments, the recirculation purging system may be performed for the gas inside the container and/or the gas inside the load port. For example, since the container is not hermetically sealed, a purge gas introduced to the container may be released to the outside environment, such as the inside volume of a load port, in which the container is placed. The purge gas may be captured from the container or from the load port, filtering and/or purifying, and then recirculated back to the container FIG. 10 illustrates a load port system having recirculation purging according to some embodiments. The recirculation purging system may be coupled to a load port, so that when a container is placed on a support of the load port, the recirculation purging system may be activated. The load port may be sealed, e.g., connected to a vacuum pump for evacuating the gas inside the load port. A recirculated purge gas may be provided to the container to keep the container in a clean dry state.

Nozzles 1095 may be disposed on a support 1090 of a load port 1000. The nozzles may be configured to provide a purge to the container 1010. Multiple nozzles 1095 may be included in the support 1090, and may be configured to provide recirculated purge gas to the container. Alternatively, one nozzle may be configured to accept the purge gas to the container, and one nozzle may be configured to exhaust the purge gas from the container. A recirculation purging system may be coupled to the support 1090, including a recirculated path and a refresh path. A recirculated path may include a purge gas flow to a nozzle to the container, an exhaust purge gas flow from the load port (or from another nozzle from the container, not shown), a pump system 1040, and a filter/purifier 1050. A refresh path may include a fresh purge gas supply 1080, which may be configured to replace or add to the recirculated purge gas.

In some embodiments, the pump system 1040 may be used to first evacuate the gas inside the load port, and then discards the evacuated gas. After a certain time, the gas in the load port may be switched to the recirculation tank, to be recirculated back to the container. Alternatively, a sensor may be used to monitor the gas in the load port, for example, to ensure that the gas in the load port is clean before bring the gas into the recirculation tank. For example, the load port may be exposed to an outside ambient, e.g., a load port door is open. A container may be placed on the support of the load port. The load port may be sealed, e.g., the door is closed. The gas inside the load port is evacuated, for example, by a pumping system.

After the load port is evacuated, e.g., all gases are removed, the purge gas may be provided to the container. The gas in the load port (and optionally in the container) may be pumped out to a recirculation tank, which may be returned to the container after being purified.

Alternatively, the purge gas may be provided to the container while the load port is evacuated. Since the gas in the load port may contain air ambient, the exhaust may be discarded. After a certain evacuation time, or after a sensor indicating that the gas inside the load port is clean, the exhaust may be switched to the recirculation tank, to be purified and recirculated back to the container.

A switch mechanism 1060 may be configured to switch between the recirculated purge gas flow or the refresh purge gas flow, which may allow the fresh purge gas to replace the recirculated purge gas. The switch mechanism 1060 may be configured to switch the connection of the refresh purge gas flow to the recirculated purge gas flow, which may allow the fresh purge gas to add to the recirculated purge gas.

The switch mechanism 1060 may be controlled by a sensor 1070, such as a moisture sensor. For example, when moisture sensor 1070 detects a high level of moisture in the recirculated purge flow, the switch mechanism 1060 is switched to accept fresh purge gas from the supply 1080. After the moisture level goes down, e.g., to an acceptable level, the recirculation of the purge gas may resume, e.g., the switch mechanism 1060 may switch back to accept the recirculated purge gas from the recirculated path. Additional sensors or analytical devices may be added to monitor the contaminant concentration in the recirculated purge gas flow.

Figure 11A:
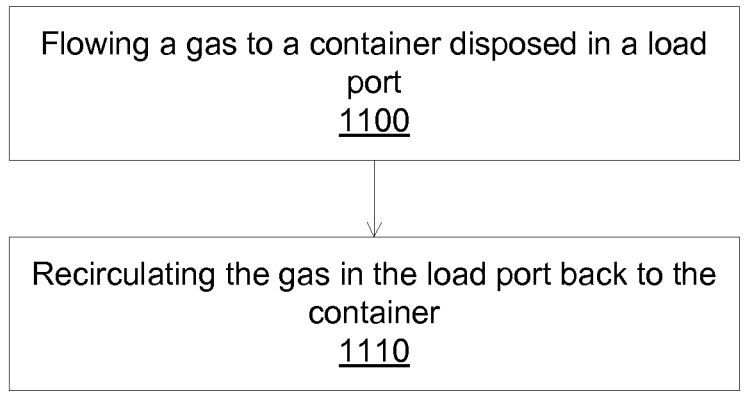
FIGS. 11A-11B illustrate flow charts for recirculation purging of a semiconductor container according to some embodiments.
Figure 11B:
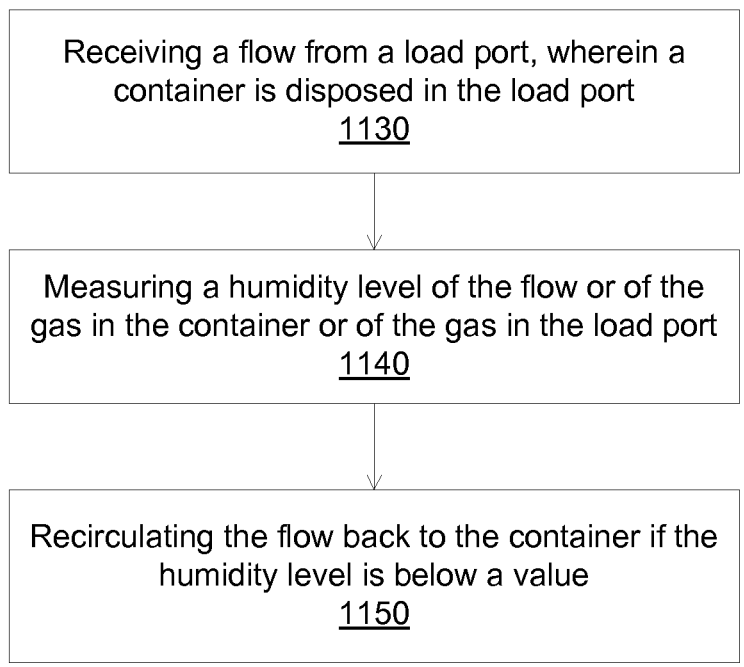

FIGS. 11A-11B illustrate flow charts for recirculation purging of a semiconductor container according to some embodiments. In FIG. 11A, a recirculated purge gas is applied to a container to purge the container. A purge flow may be provided to the container, which is placed in a sealed load port. The gas inside the load port (and optionally inside the container) may be exhausted to a recirculation system, which may return the gas to the container, after optionally filtering and/or purifying the gas flow. Operation 1100 flows a purge gas to a container, which is disposed on a support, such as a support of a load port. The purge gas may be from a recirculation tank. Operation 1110 exhausts gases in the load port (and optionally in the container) to the recirculation tank. The gas inside the recirculation tank may be continuously purified, for example, through a purifier to remove moisture and/or other organic contaminants.

In FIG. 11B, the gas in the recirculation tank may be monitored, for example, to assess the moisture level, the organic contamination level, or the particle level. When the contamination is below an acceptable level, for example, the moisture level is lower than an acceptable level, such as below 1 ppb or below 100 ppt, the recirculation tank returns the purge gas back to the container. If the contamination level exceeds the acceptable value, the gas in the recirculation tank may be replaced with a fresh clean dry gas, e.g., a fresh clean dry gas is supplied to the recirculation tank instead of the recirculated gas from the recirculation tank. Alternatively, a fresh clean dry gas may be added to the recirculation tank to reduce, e.g., dilute, the contamination level.

Operation 1130 receives a flow from a load port, in which a container is disposed therein. The flow may be provided to a recirculation tank. A pumping system may be used to extract the gas flow from the load port. Operation 1140 measures a humidity level of the gas in the load port, in the flow or in the container. Operation 1150 recirculates the flow from the recirculation tank back to the container if the humidity level is below an acceptable value, such as below 1 ppb or below 100 ppt. If the humidity level is high, e.g., higher than 1 ppb or higher than 100 ppt, fresh clean dry gas may be used, either to replace or to add, to the recirculation tank.

Figure 12:
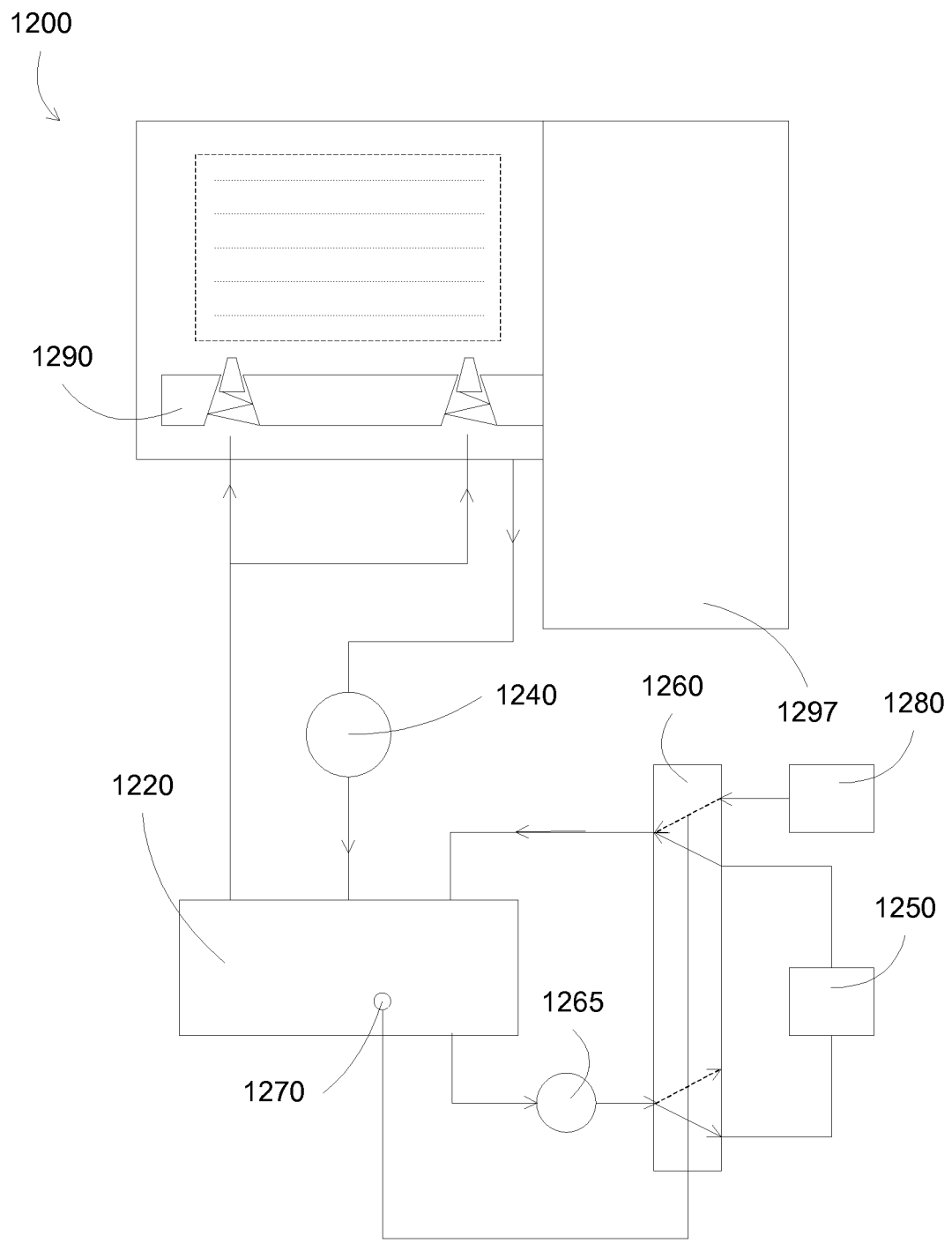
FIG. 12 illustrates a load port system having recirculation purging according to some embodiments.

FIG. 12 illustrates a load port system having recirculation purging according to some embodiments. The recirculation purging system may be coupled to a sealable load port, so that when a container is placed on a support of the load port, the recirculation purging system may be activated. Nozzles may be disposed on a support 1290 of a load port 1200. The nozzles may be configured to provide a purge to the container.

A recirculation purging system may be coupled to the support 1290 and the load port, including an optional pump system 1240 and a recirculation/purifier assembly. Gases from the load port, and/or optionally from the container, may be evacuated by the pump system and deliver to the recirculation tank.

The recirculation/purifier assembly may include a recirculation tank 1220 a filter/purifier 1250, and a pump system 1265. The pump system 1265 (which may include a pump or a fan) may recirculate the purge gas in the recirculation tank 1220 through a purifier 1250, thus may continuously and repeatedly purify the gas in the recirculation tank, such as continuously removing moisture from the recirculated gas. After being purified, the exhaust gas may be recirculated back to the container.

A refresh path may include a fresh purge gas supply 1280, which may be configured to replace or add to the recirculated purge gas. A switch mechanism 1260 may be configured to switch between the recirculated purge gas flow and the refresh purge gas flow. The switch mechanism 1260 may be controlled by a sensor 1270, such as a moisture sensor, which may be disposed in the recirculation tank 1220 (or at any other places such as in the recirculation path. Thus the switch 1260 may switch between fresh clean dry gas or recirculated purge gas. Further, the switch 1260 may be controlled by a controller, which may perform a cyclic recirculated purge flow.

Figure 13:
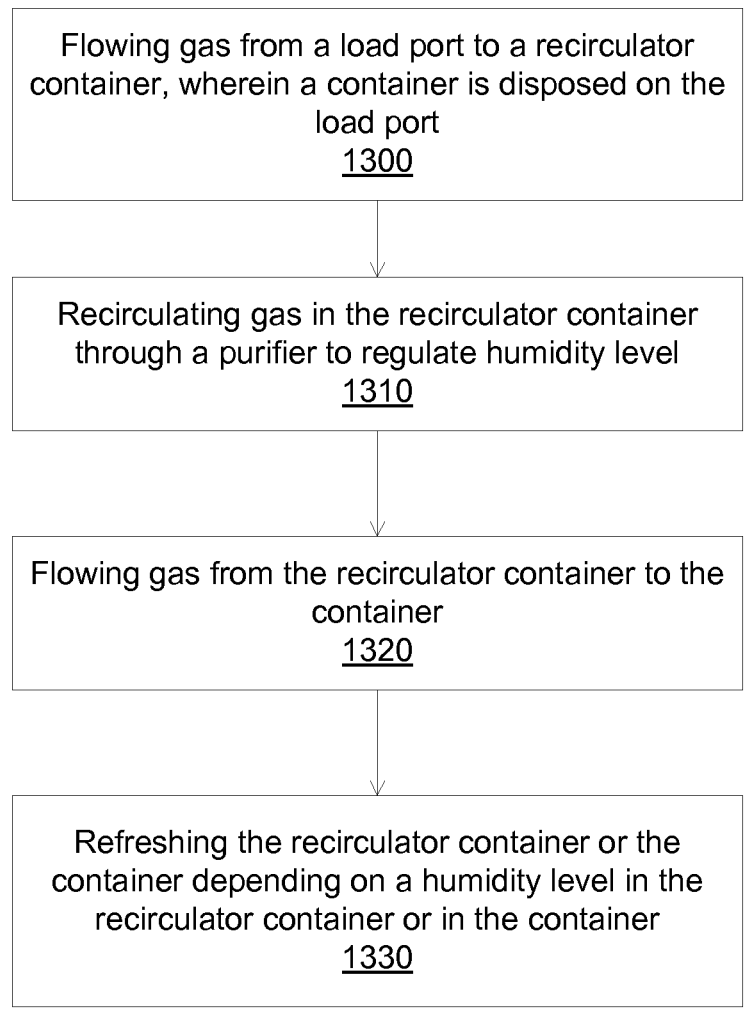
FIG. 13 illustrates a flow chart for recirculation purging of a semiconductor container according to some embodiments.

FIG. 13 illustrates a flow chart for recirculation purging of a semiconductor container according to some embodiments. A recirculated purge tank may be placed in the recirculation gas path to purge the container. Operation 1300 flows a gas from a load port, in which a container may be disposed on a support of the load port. The gas may be an exhaust gas from the load port, operable by a pumping system. The gas may be flowed to a recirculation tank. Operation 1310 recirculates the gas in the recirculation tank through a purifier to regulate the humidity level. Operation 1320 flows the gas from the recirculation tank back to the container, for example, by a pumping system. Operation 1330 refreshes the gas in the recirculation tank depending on the humidity level, either in the recirculation tank, in the container, or in the recirculation gas path. Gases in the recirculation tank may be replaced by a fresh gas from a clean dry gas source. Gases in the recirculation tank may be added with a fresh gas from a clean dry gas source.

What is claimed is:

1. A recirculation purging system, comprising:
    a container;
    a load port;
    wherein the container is disposed inside the load port;
    a purge gas flow input to the container;
    an exhaust purge gas flow output from the container; and
    a recirculation tank configured to provide a recirculated gas flow to the container and to accept an exhaust purge gas flow output from the container.

2. The recirculation purging system of claim 1, further comprising:
    at least one nozzle disposed on a support of the load port configured to provide the purge gas flow input to the container or remove exhaust purge gas flow output from the container.

3. The recirculation purging system of claim 2, further comprising:
    wherein the at least one nozzle is open when the container is placed on the support of the load port.

4. The recirculation purging system of claim 2, further comprising:
    wherein the at least one nozzle comprises a spring, and
    wherein the spring is configured to push a nozzle plug upward to close a gas path in its resting state.

5. The recirculation purging system of claim 4, further comprising:
    wherein placing the container on the nozzle plug pushes the nozzle plug downward thereby opening the gas path.

6. The recirculation purging system of claim 1, further comprising:
    a pump system configured to first evacuate a gas inside the container and subsequently discards the gas when the recirculation purging system is initially activated.

7. The recirculation purging system of claim 6, further comprising:
    wherein the pump system is configured to switch the gas inside the container with the recirculated gas flow when the recirculation purging system is subsequently in use after its initial activation.

* * * * *